United States Patent [19]

Serikawa et al.

[11] Patent Number: 5,132,754
[45] Date of Patent: Jul. 21, 1992

[54] THIN FILM SILICON SEMICONDUCTOR DEVICE AND PROCESS FOR PRODUCING THEREOF

[75] Inventors: Tadashi Serikawa; Seiichi Shirai; Akio Okamoto, all of Higashimurayama; Shirou Suyama, Iruma, all of Japan

[73] Assignee: Nippon Telegraph and Telephone Corporation, Tokyo, Japan

[21] Appl. No.: 222,966

[22] Filed: Jul. 21, 1988

[30] Foreign Application Priority Data

Jul. 27, 1987 [JP] Japan ................. 62-185361
Jul. 7, 1988 [JP] Japan ................. 63-167841

[51] Int. Cl.⁵ .............. H01L 27/01; H01L 27/13; H01L 29/78
[52] U.S. Cl. .............................. 357/23.7; 357/4; 357/59
[58] Field of Search ........... 357/60, 59 A, 59 E, 357/23.7, 4

[56] References Cited

U.S. PATENT DOCUMENTS

| 4,442,448 | 4/1984 | Shimbo | 357/59 E |
| 4,453,172 | 6/1984 | Farrow et al. | 357/4 |
| 4,556,895 | 12/1985 | Ohata | 357/16 |
| 4,597,160 | 7/1986 | Ipri | 29/571 |
| 4,632,712 | 12/1986 | Fan et al. | 357/60 |
| 4,698,652 | 10/1987 | Umemoto et al. | 357/4 |
| 4,772,927 | 9/1988 | Saito et al. | 357/59 E |
| 4,809,056 | 2/1989 | Shirato et al. | 357/23.7 |

FOREIGN PATENT DOCUMENTS

| 0030638 | 6/1981 | European Pat. Off. . |
| 0080851 | 6/1983 | European Pat. Off. . |
| 0225592 | 6/1987 | European Pat. Off. . |

OTHER PUBLICATIONS

Proceedings of the S.I.D., vol. 25, No. 2, 1984, pp. 117-121, SID, Los Angeles, US; T. Unagami et al.; "High-voltage polycrystalline-silicone TFT for addressing electroluminescent devices"; p. 118, Section B.

Japanese Journal of Applied Physics. Supplements, vol. 22, No. 22-1, 1983, pp. 213-216, Tokyo, JP; K. Shibata et al.; "Growth of large grained silicon on insulator by electron beam annealing and performance of MOS devices"; p. 214, para. 3.1.

Applied Physics Letters, vol. 48, No. 13, 31 Mar. 1986, pp. 838, 839; American Institute of Physics, Woodbury, NY, US; H. Arai et al.; "Recrystallization of amorphous silicon film by tungsten halogen lamp annealing".

Malhi et al IEEE Trans, Electron Devices vol. 32 1985 pp. 258-281; Characteristics and Three-Dimensional . . .

Celler et al IEEE Electron Device Letters, vol. Edl.2 No. 12, Dec. 1981; pp. 316-318; Effects of Grain Coundaries . . . .

Primary Examiner—Jerome Jackson, Jr.
Assistant Examiner—Hung Xuan Dang
Attorney, Agent, or Firm—Spencer, Frank & Schneider

[57] ABSTRACT

A thin film silicon semiconductor device provided on a substrate according to the present invention comprises a thin polycrystalline silicon film having a lattice constant smaller than that of a silicon single crystal and a small crystal grain size. This thin polycrystalline silicon film can be obtained by depositing a thin amorphous silicon film in an inert gas having a pressure of 3.5 Pa or lower by a sputtering deposition method and annealing the thin amorphous silicon film for a short time of 10 seconds or less to effect polycrystallization thereof. A thin film silicon semiconductor device comprising such a thin polycrystalline silicon film having a small lattice constant has excellent characteristics including a carrier mobility of 100 $cm^2/V \cdot s$ or higher.

13 Claims, 10 Drawing Sheets

THIN FILM SILICON SEMICONDUCTOR DEVICE AND PROCESS FOR PRODUCING THEREOF

BACKGROUND OF THE INVENTION

1. FIELD OF THE INVENTION

The present invention relates to a thin film silicon semiconductor device which is important as a constituent element of a three-dimensional integrated circuit and a switching element for a flat panel display or the like and a process for producing the same, and particularly to a thin film silicon semiconductor device having excellent characteristics and a process for producing the same.

2. DESCRIPTION OF THE PRIOR ART

Thin film silicon semiconductor devices have recently attracted attention particularly as a constituent element of a three-dimensional integrated circuit and a switching element for a flat panel display, and hence are under extensive studies. Such semiconductor devices are reported in detail in a paper of D. S. Malhi et al. (IEEE Trans, Electron Devices ED-32 (1985) pp. 258-281). Thin film silicon semiconductor devices as used in the above-mentioned applications, when in the form of a field-effect transistor, comprise a thin silicon film of 0.05 to 2.0 μm in thickness deposited as the basic constituent on an insulating substrate. Among them, those having a coplanar structure or a staggered structure are most widely used. FIG. 1 is a cross-sectional view of a thin film silicon semiconductor device having a coplanar structure. This semiconductor device has a structure comprising an insulating film 2 formed on the surface of an insulating substrate 1 and a series of a thin silicon film 3, a gate insulating film 4 and a gate electrode 5 laminated thereon in this order, plus, source electrode/drain electrode 6 for output power and metallic wiring 7. FIG. 2 is a cross-sectional view of a thin film silicon semiconductor device having a staggered structure. This semiconductor device comprises a gate electrode 5, a gate insulating film 4, and a thin silicon film 3 laminated in this order on an insulating film 2. Source electrode/drain electrode 6 are formed on the gate insulating film 4. When a positive or negative voltage is applied to the gate electrode 5, carriers are induced in the inside of the thin silicon film 3, particularly near the interface of the thin silicon film 3 with the gate insulating film 4, and flow between the source electrode and the drain electrode to develop an output voltage between the metallic wiring 7, whereby this thin film silicon semiconductor device is actuated. As is apparent from the above description, the characteristics of this semiconductor device are greatly affected by the properties of the thin silicon film.

A thermal chemical vapor deposition method (thermal CVD method) basically comprising thermal decomposition of a gas comprising silane ($SiH_4$), disilane ($Si_2H_6$), or the like as the main raw material, and a plasma chemical vapor deposition method (plasma CVD method) utilizing plasma and capable of easily effecting a treatment at a lower substrate temperature than the former method have heretofore been employed for the formation of a thin silicon film in a thin film silicon semiconductor device. The plasma CVD method, which involves a lower temperature at the time of film deposition than the thermal CVD method, is capable of depositing a thin silicon film even at 400° C. or below and hence allows the use of an inexpensive substrate such as glass, and is employed for the production of a switching element for a flat panel display using a liquid crystal. Since a thin silicon film formed by this method is amorphous, however, the carrier mobility is as low as 1 $cm^2/V·s$, resulting in a difficulty in obtaining a high-performance thin film silicon semiconductor device.

On the other hand, since the thermal CVD method involves a higher substrate temperature than the plasma CVD method, it produces a silicon film not in an amorphous state but in a polycrystalline state. Since the substrate temperature in the thermal CVD method is 600° to 700° C. which is by far lower than the melting point of silicon, of 1,412° C. however, the resulting silicon film is at best in a polycrystalline state of fine crystals. Therefore, the carrier mobility in a thin film silicon semiconductor device produced by the thermal CVD method is at most about 10 $cm^2/V·s$, though the performance thereof is superior to that of a thin film silicon semiconductor device comprising a thin silicon film in an amorphous state formed by the plasma CVD method. Thus, the thin polycrystalline silicon film formed by the thermal CVD method also has a greatly limited scope of applications due to the substantially higher substrate temperature and the comparatively low carrier mobility.

The reason for the poor characteristics of semiconductor devices comprising a thin silicon film formed by the above-mentioned thermal or plasma CVD method resides in the amorphous or microcrystalline state, made of extremely fine crystal grains, of the thin silicon film formed by the above-mentioned method.

A common method for solving the above-mentioned problems and giving excellent characteristics to the resulting semiconductor device comprises a heat treatment after the deposition of a thin silicon film to grow crystal grains therein. Specifically, a thin silicon film is deposited by a method utilizing a chemical reaction, such as the CVD method, and is subsequently crystallized by a laser annealing method or an annealing method comprising heating the film in a furnace at a high temperature for a long time to effect the growth of into large crystal grains having a size of 1 μm or larger. Even where a large crystal grain size is provided by the above-mentioned method, the carrier mobility is at most 100 $cm^2/V·s$, which cannot be said to be large enough to enable the resulting semiconductor device to be applied to a wide variety of fields.

The above-mentioned conventional thin film silicon semiconductor devices further involve other problems in addition to the problem that high performance characteristics cannot be obtained. For a thin silicon film formed by the plasma CVD method, a trouble of the film exfoliating from the substrate frequently occurs. This results from the low substrate temperature at the time of film deposition which allows a large amount of unreacted silane gas, which is most widely used, hydrogen gas, and the like to remain in the film, with the result that these gases are released from the film during the subsequent processing of the thin film silicon semiconductor device. By contrast, the thermal CVD method does not cause the trouble of the resulting thin silicon film exfoliating from a substrate in the process for forming a thin polycrystalline silicon film thereby and in the heat-treating of the resulting thin film to provide a large crystal grain size. In this case, however, a substrate incapable of resisting high temperatures (e.g., glass) cannot be used for forming a thin film silicon semiconductor device thereon and a semiconductor device already formed the inside of a substrate is deteriorated in characteristics or broken in the case of a three-dimensional integrated circuit because the substrate is exposed to high temperatures in the above-mentioned processes.

Further, a thin film silicon semiconductor device having comparatively excellent characteristics and comprising a thin silicon film having large crystal grains involves the problem of a large lot-to-lot variation of characteristics. This arises from the size of the semiconductor device compared to the crystal grain size. FIG. 3 is a plan view of a channel region having a source electrode 8 and a drain electrode 9. When crystal grains 10 are large as shown in the figure, the number and positions of crystal grain boundaries present in a channel region which boundaries hinder transportation of carriers differ from semiconductor device to semiconductor device, resulting in a large lot-to-lot variation of characteristics. This is discussed in detail with specific examples in, for example, a paper of K. K. Ng et al. (IEEE Electron Device Letters, EDL-2, 1981, pp. 316–318).

When a thin polycrystalline silicon film is processed by etching according to a wet or dry process, crystal grain boundaries are substantially corroded as compared with the insides of crystal grains. In the case of a conventional polycrystalline silicon semiconductor device comprising a thin polycrystalline silicon film having large crystal grains, therefore, a difficulty is encountered in sharply processing the sides of the pattern of the thin polycrystalline silicon film as shown in FIG. 3. Thus, it has been difficult to produce fine thin film silicon semiconductor devices in high yield.

As described above, the conventional techniques involve the problems that it is difficult to obtain a high-performance thin film silicon semiconductor device by a process involving a low temperature, and that the production yield is low.

SUMMARY OF THE INVENTION

An object of the present invention is to provide a thin film silicon semiconductor device having excellent characteristics by solving the problems involved in the conventional thin film silicon semiconductor device. Another object of the present invention is to provide a process for producing a thin film silicon semiconductor device of the kind as described above at a low temperature in high yields.

In accordance with one aspect of the present invention, there is provided a thin film silicon semiconductor device disposed on an insulating substrate which comprises a thin polycrystalline silicon film having a lattice constant smaller than that of a single silicon crystal as the thin silicon film constituting the above-mentioned thin film silicon semiconductor device.

In accordance with another aspect of the present invention, there is provided a process for producing a thin film silicon semiconductor device on an insulating substrate which comprises the step of depositing a thin amorphous silicon film according to sputtering by glow discharge in an inert gas having a pressure of 3.5 Pa or lower, and the step of annealing the thin amorphous silicon film for a heating time of 10 seconds or shorter to effect polycrystallization thereof.

In the first aspect of the present invention, a thin film silicon semiconductor device provided on as insulating substrate, comprises:

a thin polycrystalline silicon film having a lattice constant smaller than that of a silicon single crystal as the thin silicon film constituting the thin film silicon semiconductor device.

Here, the ratio of the lattice constant of the thin polycrystalline silicon film to that of the silicon single crystal may be 0.999 or lower.

The thin polycrystalline silicon film may have [111] axis orientation in a direction perpendicular to the surface of the substrate or in a direction close thereto.

The thin polycrystalline silicon film may contain boron in a concentration of $10^{14}$ to $10^{17}/cm^3$.

The thin polycrystalline silicon film may contain as an impurity at least one element selected from phosphorous and arsenic in a total impurity concentration of $10^{14}$ to $10^{17}/cm^3$.

The insulating substrate may be a glass substrate.

The thin polycrystalline silicon film may be formed through an insulating film on the insulating substrate, and the device may further comprise a gate insulating film and a gate electrode formed in the order named on the thin polycrystalline silicon film, and a source electrode and a drain electrode may be formed on the first insulating film while sandwiching the thin polycrystalline silicon film.

The thin polycrystalline silicon film may be formed on the substrate through an insulating film, a gate electrode and a gate insulating film; and the device may further comprise a source electrode and a drain electrode formed on the gate insulating film while sandwiching the thin polycrystalline silicon film.

In the second aspect of the present invention, a process for producing a thin film silicon semiconductor device on an insulating substrate, comprises the steps of:

depositing by sputtering a thin amorphous silicon film by glow discharge in an inert gas having a pressure of 3.5 Pa or lower; and annealing the thin amorphous silicon film to form a polycrystalline film and to have a lattice constant smaller than that of silicon single crystal.

Here, the heating time of the annealing may be not longer than 10 seconds.

The annealing may be effected by laser beam irradiation, electron beam irradiation or infrared ray irradiation.

The thin amorphous silicon film may be deposited on an insulating film formed on the insulating substrate.

A gate insulating film may be formed on the thin polycrystallized silicon film, and a gate electrode may be formed on the gate insulating film, while a source electrode and a drain electrode may be formed on the insulating film.

The thin amorphous silicon film may be formed on a gate insulating film formed through a first insulating film and a gate electrode on the insulating substrate.

The gate insulating film may be formed so as to cover the insulating film and the gate electrode, and a source electrode and a drain electrode may be formed on the insulating film while sandwiching the thin polycrystallized silicon film.

The sputtering may be effected using a silicon target containing as an impurity at least one element selected from boron, phosphorus, and arsenic in a total impurity concentration of $10^{14}$ to $10^{17}/cm^3$.

The process for producing a thin film silicon semiconductor device may further comprise the step of introducing as an impurity at least one element selected from boron, phosphorous, and arsenic in a total impurity concentration of $10^{14}$ to $10^{17}$/cm$^3$ into the thin amorphous silicon film by ion implantation.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 4A:
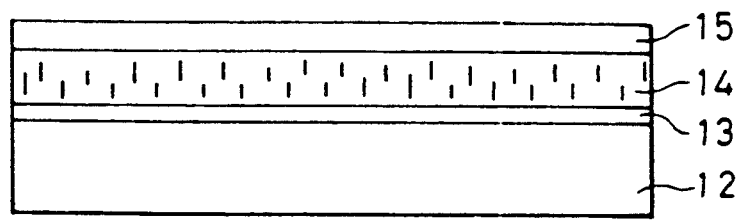
FIGS. 4A to 4D are cross-sectional views of materials at subsequent processing steps in the production of a thin film silicon semiconductor device according to the present invention.
Figure 4B:
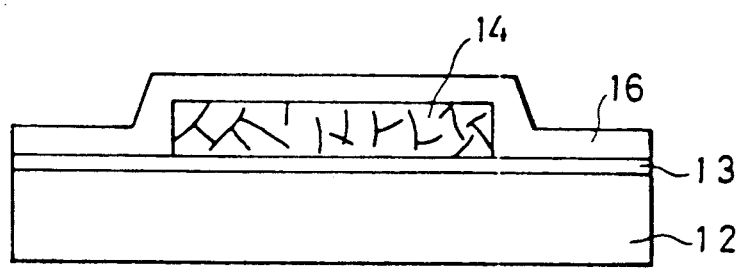
Figure 4C:
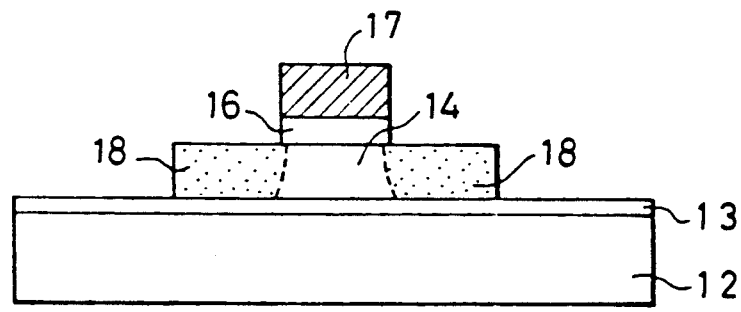
Figure 4D:
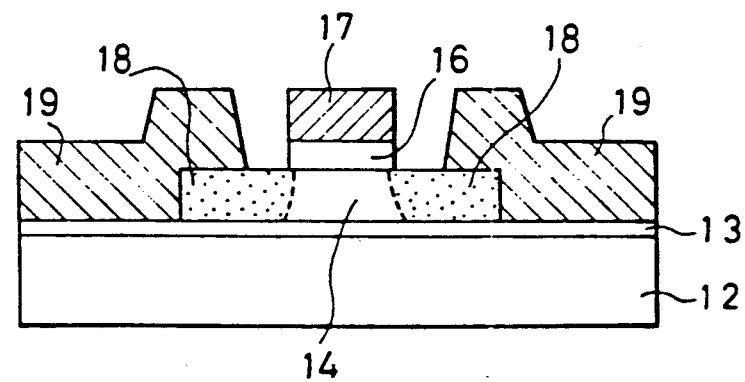

FIGS. 4A to 4D are cross-sectional views of materials at subsequent processing steps in the production of a thin film silicon semiconductor device having a coplanar structure according to the present invention. FIG. 4A shows a layered structure made by subjecting substrate 12, of, for example, glass, to treatments such as polishing and washing, depositing thereon a first insulating film 13 such as a silicon nitride film or a SiO$_2$ film, depositing thereon a thin silicon film 14 by sputtering, and further depositing thereon a second insulating film 15 (again an SiO$_2$ film or a silicon nitride film) having a thickness of 0.05 to 1.0 μm for preventing contamination from the outside. FIG. 4B shows the structure resulting from irradiating the thin silicon film 14 with a laser beam to effect a short-time heat treatment thereby resulting in a polycrystalline state to the thin silicon film 14, processing the thin silicon film 14 by a customary photolithography technique and a customary etching technique, removing the second insulating film 15, and forming a gate insulating film 16 having a thickness of 0.05 to 0.2 μm consisting of a SiO$_2$ film or a silicon nitride film. FIG. 4C shows the structure resulting from forming a gate electrode 17 on the gate insulating film 16 by photolithography or the like and introducing an impurity into the thin silicon film 14 to form source electrode/drain electrode 18. FIG. 4D shows the structure resulting from forming metallic films 19 (Al or the like) as wiring by photolithography or the like.

Figure 5:
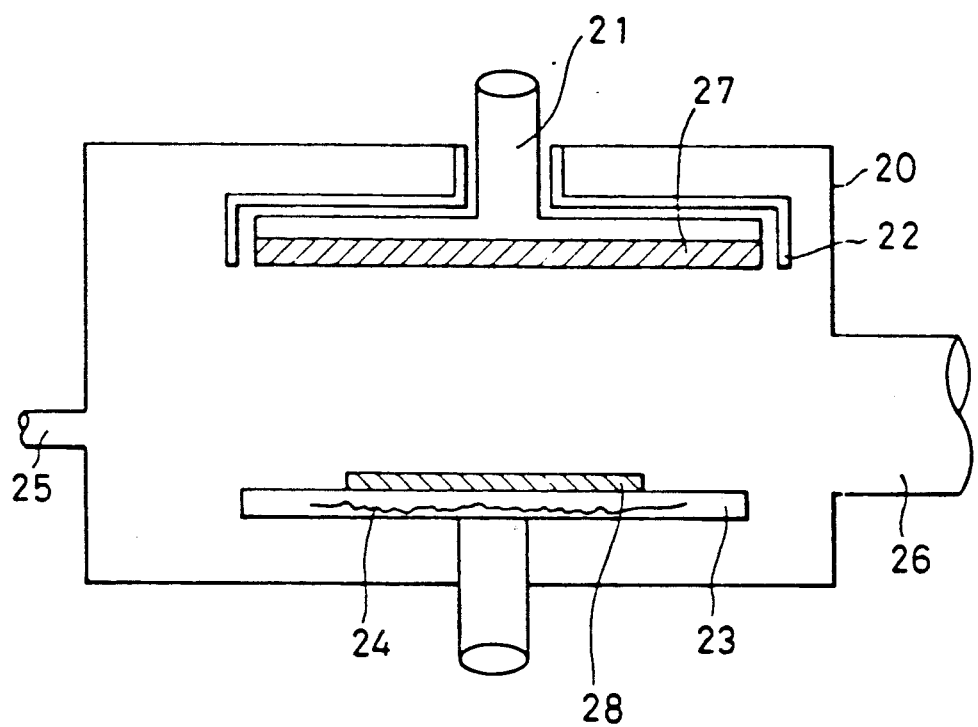
FIG. 5 is a schematic cross-sectional view of a sputtering apparatus used for deposition of a thin silicon film according to the present invention.

An apparatus used for depositing a thin silicon film is shown schematically in FIG. 5. This apparatus which includes a vacuum chamber 20, an electrode 21, an electrode shield 22, a substrate holder 23, a heater 24, a gas-introducing inlet 25, and a gas-discharging outlet 26. A target 27 made of silicon is placed on the electrode 21, while a substrate 28 is placed on the substrate holder 23. The vacuum chamber 20 is evacuated. An inert gas is introduced into the vacuum chamber 20 from the gas-introducing inlet 25 and a negative DC voltage or a high-frequency voltage which usually has a frequency of 13.56 MHz is applied to the electrode 21 to bring about glow discharge which serves to form ions. The ions formed collide with the surface of the target 27 to strike silicon atoms and drive out them from the surface of the target 27. The silicon atoms thus sputtered are deposited on the substrate 28 to form a thin silicon film. The electrode shield 22 is provided to avoid etching of the electrode 21 while allowing sputtering of only the target 27. The heater 24 is provided to enable the substrate 28 to be heated to arbitrary temperature.

A thin silicon film was deposited on a substrate using argon as a sputtering gas at an argon pressure of 2.0 Pa, a sputtering power of R.F. 1.5 KW and a substrate temperature of 100° C. or lower. The thin silicon film obtained by sputter deposition assumes a dense amorphous state having a fibrous texture since the substrate temperature at the time of sputter deposition is low and some silicon atoms already deposited on the substrate are pushed into the film being deposited by silicon atoms and argon atoms colliding therewith a high energy according to a knock-on phenomenon peculiar to sputtering. The internal stress of the deposited film as measured by the curvature of the substrate is a compressive stress.

Figure 6:
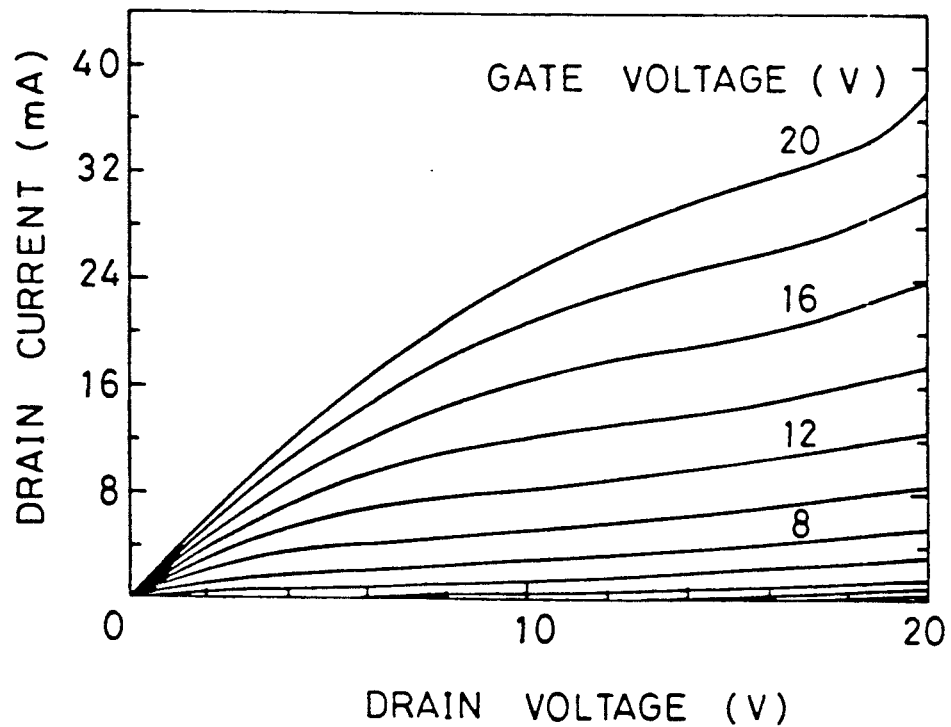
FIG. 6 is a diagram illustrating drain voltage versus drain current characteristic curves of a thin film silicon semiconductor device according to the present invention.

An argon laser beam with an irradiation output of 2.8 W and a beam diameter of 50 μl was scanned on the thin amorphous silicon film for an irradiation time of 1 millisecond on every part of the film being irradiated therewith to anneal the film and to thereby convert the thin amorphous silicon film into a thin polycrystalline silicon film. Thereafter, an N-channel type thin film silicon semiconductor device was produced according to the process shown in FIGS. 4A-4D. FIG. 6 is a diagram illustrating the drain voltage versus drain current characteristics of an N-channel type thin film silicon semiconductor device as produced in the above-mentioned manner a different gate voltages. The channel length and channel width of this thin film silicon semiconductor device were 40 μm and 1,500 μm, respectively. The carrier mobility found from this figure was 190 cm$^2$/V·s. As can be seen in FIG. 6, the thin film silicon semiconductor device according to the present invention shows good triode characteristics and has a large carrier mobility.

Figure 7:
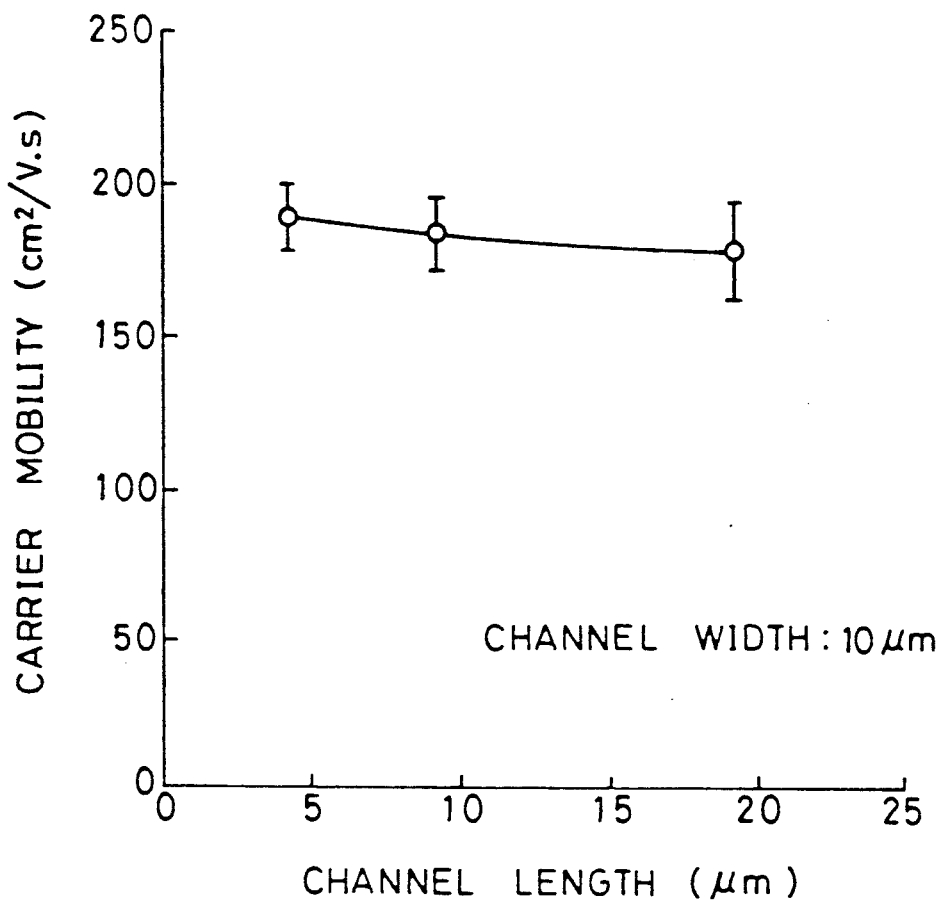
FIG. 7 is a diagram illustrating the relationship between the channel length and the carrier mobility in thin film silicon semiconductor devices according to the present invention.

FIG. 7 shows the carrier mobilities as measured in samples having a fixed channel width of 10 μm and varying channel lengths. The other production conditions were the same as the case of the sample as shown in FIG. 4. It can be seen from these results that the variation of carrier mobility was very small even when the channel length was varied. This indicates that, according to the present invention, the lot-to-lot variation of characteristics of thin film silicon semiconductor devices can be very much reduced even if the number of crystal grain boundaries present in the channel varies from lot to lot, thus providing extremely advantageous conditions in actual designing and use of a semiconductor device.

Figure 8:
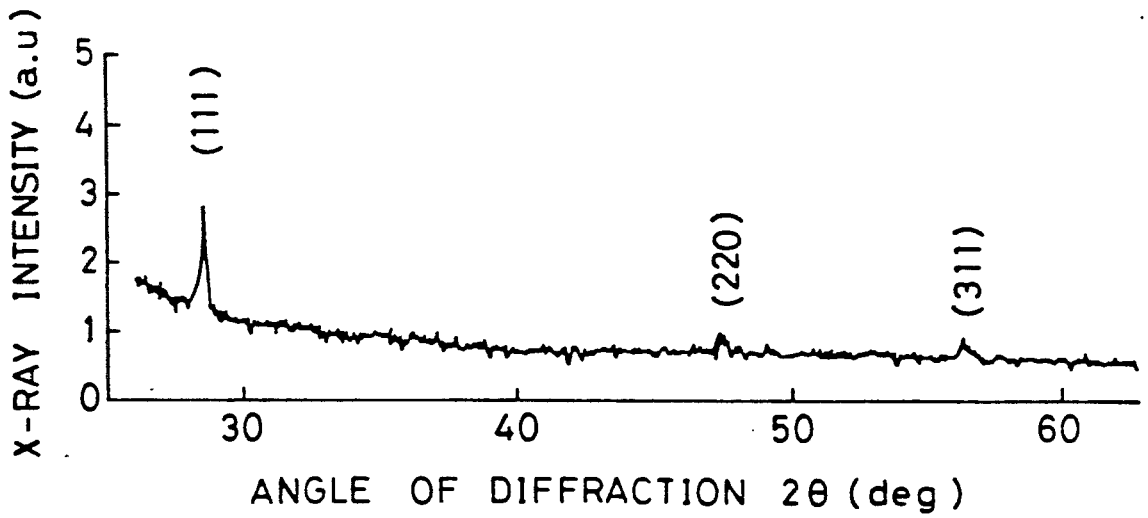
FIG. 8 is an X-ray diffraction chart of a thin silicon film according to the present invention.

The crystal structure of a thin polycrystalline silicon film produced in the above-mentioned manner was examined using X-ray diffraction. FIG. 8 shows such an X-ray diffraction measurement of the thin silicon film according to the present invention. It can be seen from this figure that a thin polycrystalline silicon film according to the present invention is a [111] axis-oriented thin polycrystalline silicon film comprising the largest number of crystal grains having a [111] axis in the direction perpendicular to the surface of the substrate or in a direction close thereto and a small number of crystal grains having a [220] axis or a [311] axis in those directions. That is, the silicon film has the largest number of crystal grains having a {111} face or a face close thereto which is parallel to the surface of the substrate. The diffraction peak intensity ratio (111)/(200) was about 5, which is conspicuously high compared to 1.8, as the intensity ratio of a randomly-oriented polycrystalline silicon powder. Further, it was found that the lattice constant of the crystal grain determined from the positions of peaks was 5.411Å, which is smaller than 5.43086Å (see S. M. Sze: "Physics of Semiconductor Devices", John Wiley & Sons, New York; 1969, P. 58), as the lattice constant of bulk silicon or a thin silicon film formed by the CVD method. The crystal grain size determined from the half value width of the (111) peak was about 0.06 μm. The thickness of this thin polycrystalline silicon film was 0.16 μm.

Figure 9:
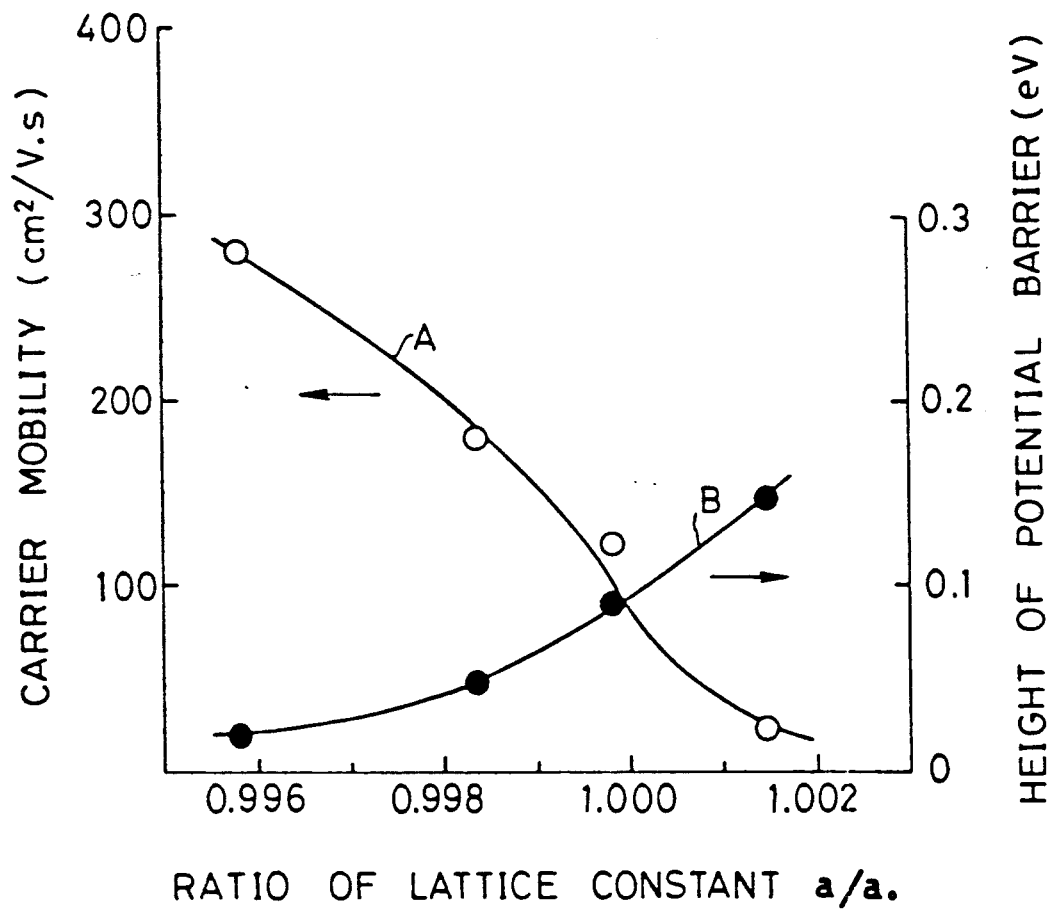
FIG. 9 is a diagram illustrating variations of the carrier mobility and the height of potential barrier developed in crystal grain boundaries with the rate of change in the lattice constant of polycrystalline silicon film in thin film silicon semiconductor devices.

It is known that the characteristics of a thin film silicon semiconductor device comprising a thin polycrystalline silicon film are conspicuously affected by the properties of crystal grain boundaries, and that the lower the potential barrier developed in crystal grain boundaries, the higher the carrier mobility. FIG. 9 shows on the relationships of the carrier mobility (Curve A) and the height of the potential barrier, determined from the dependence of drain current on temperature, (Curve B) with the ratio of the lattice constant a/a$_0$ where a represents the lattice constant of polycrystalline silicon film and a$_0$ represents the lattice constant of a silicon single crystal in thin film silicon semiconductor devices. It can be seen from FIG. 9 that, as the lattice constant becomes smaller, the height of the potential barrier becomes lower and the carrier mobility correspondingly becomes higher. With respect to thin film silicon semiconductor devices comprising a thin polycrystalline silicon film having a lattice constant smaller than that of the single silicon crystal, the carrier mobility was as more than 70 cm$^2$/V·s despite fine crystal grains. Particularly when the ratio of the lattice constant of the thin polycrystalline silicon film to that of the silicon single crystal is 0.999 or less, the carrier mobility was 150 cm$^2$/V·s or higher. On the other hand, when a thin polycrystalline silicon film having a lattice constant equal to or larger than that of the silicon single crystal is used, a thin film silicon semiconductor device having excellent characteristics cannot be obtained.

Figure 3:
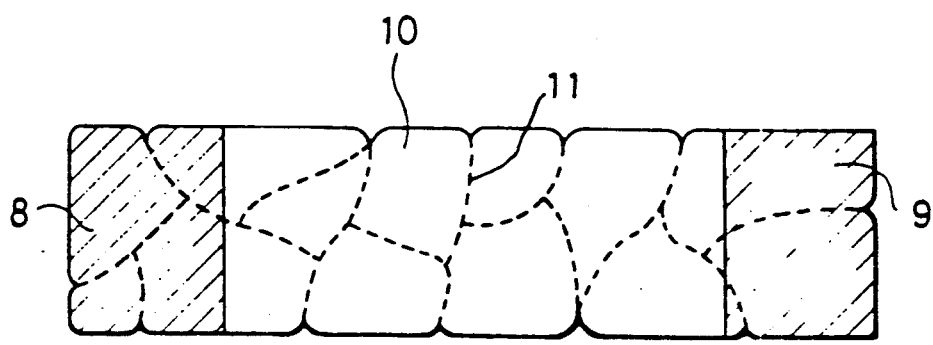
FIG. 3 is a plan view of a channel region of a conventional thin film silicon semiconductor device.

As described above, the thin film silicon semiconductor device of the present invention has excellent characteristics despite a minute crystal grain size, as compared to conventional ones. The fact that excellent characteristics can be secured despite a minute crystal grain size is of great significance in producing thin film silicon semiconductor devices in high yield. Crystal grain boundaries are conspicuously different not only is electrical properties but also in processability compared to the interior of crystal grains. Crystal grain boundaries are notably corroded in processing a thin silicon film by a wet or dry etching process, compared to the interior of crystal grains. This results in a thin silicon film comprising large crystal grains shown in FIG. 3 a conventional thin film silicon semiconductor device. Thus, it has been difficult to produce fine thin film silicon semiconductor devices in high yield. By contrast, according to the present invention, a thin silicon having minute crystal grains can be sharply processed to enable a fine semiconductor device to be easily produced.

As described above, a thin polycrystalline silicon film for use in a thin film semiconductor device having excellent performance characteristics is obtained when high energy particles collide with silicon atoms already deposited on the substrate during the course of deposition of the thin silicon film to push some silicon atoms into the interior of the film. Therefore, it is believed that the properties of the deposited thin film differ due to sputtering conditions. Stated another way, a film of the kind described above can also be obtained by a vacuum evaporation and deposition method combined with irradiation of the film being deposited with high energy particles during the formation of the film. This method, however, requires a unit for emission and acceleration of high energy particles in addition to an evaporation source, leading to a difficulty in deposition on a large-sized substrate and in uniform deposition. Such problems can be easily solved by the sputtering method.

Figure 10:
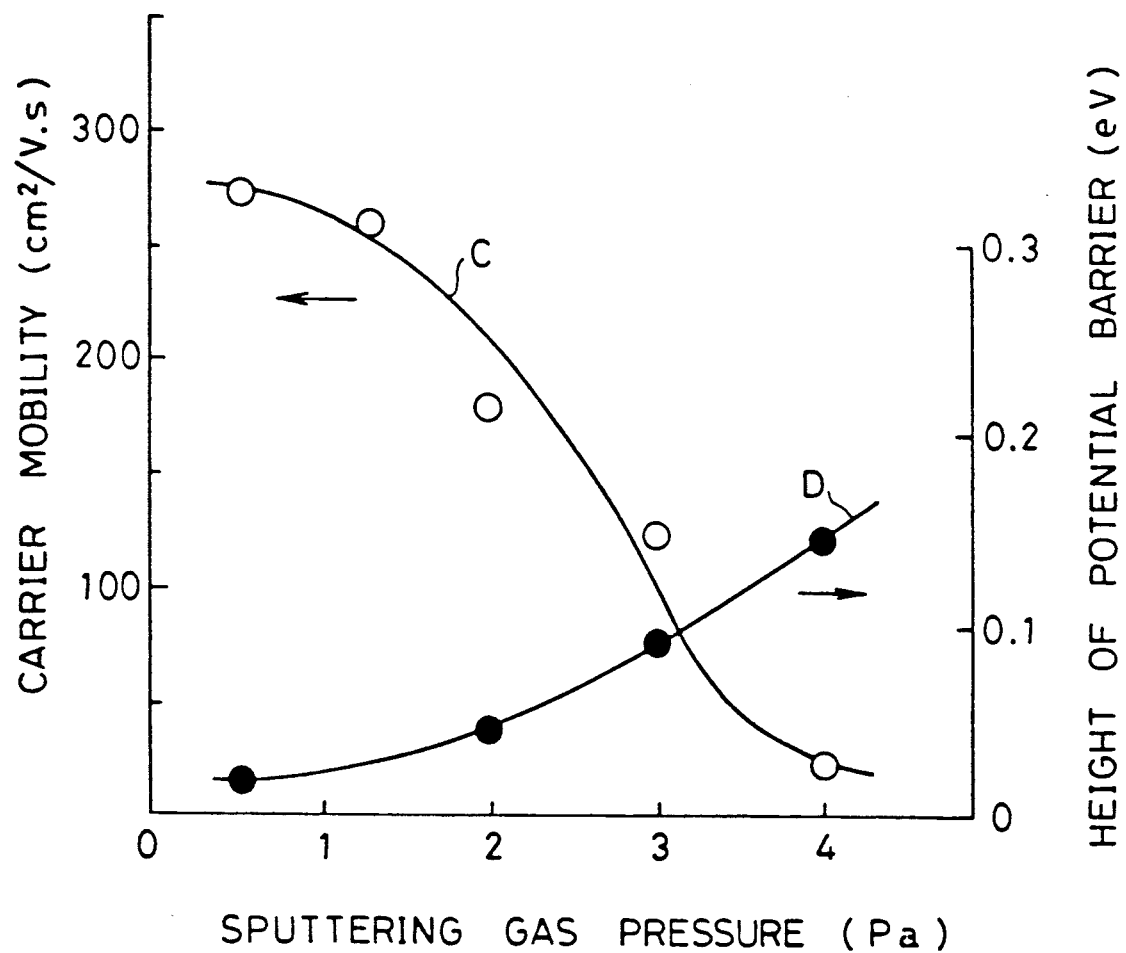
FIG. 10 is a diagram illustrating variations of the carrier mobility and the height of potential barrier developed in crystal grain boundaries with the sputtering gas pressure at the time of deposition of a silicon film.

FIG. 10 shows variations of the carrier mobility (Curve C) and of the height of the potential barrier developed in crystal grain boundaries (Curve D) compared to the sputtering gas pressure at the time of deposition of thin silicon film. Argon was used as a sputtering gas for deposition of a thin silicon film, and a laser annealing method was employed for polycrystallization under conditions of a laser power of 2.8 W and an irradiation time of 1 ms. The deposited thin silicon films showed [111] axis orientation irrespective of the argon pressure. As can be seen from the figure, the lower the sputtering gas pressure, the lower the potential barrier and hence the higher the carrier mobility. Particularly when the pressure was 3.5 Pa or lower, the effect was notable. Particularly when the pressure was 2.5 Pa or lower, the carrier mobility becomes 150 cm2/V·s. With an increase in the sputtering gas pressure, the frequnency of collision of high energy particles with argon atoms increases to lose the energy of high energy particles colliding with a substrate, resulting in a reduction in the aforementioned knock-on effect. Therefore, as shown in FIG. 10, the carrier mobility notably lowered when the sputtering gas pressure exceeded 3.5 Pa.

Figure 11:
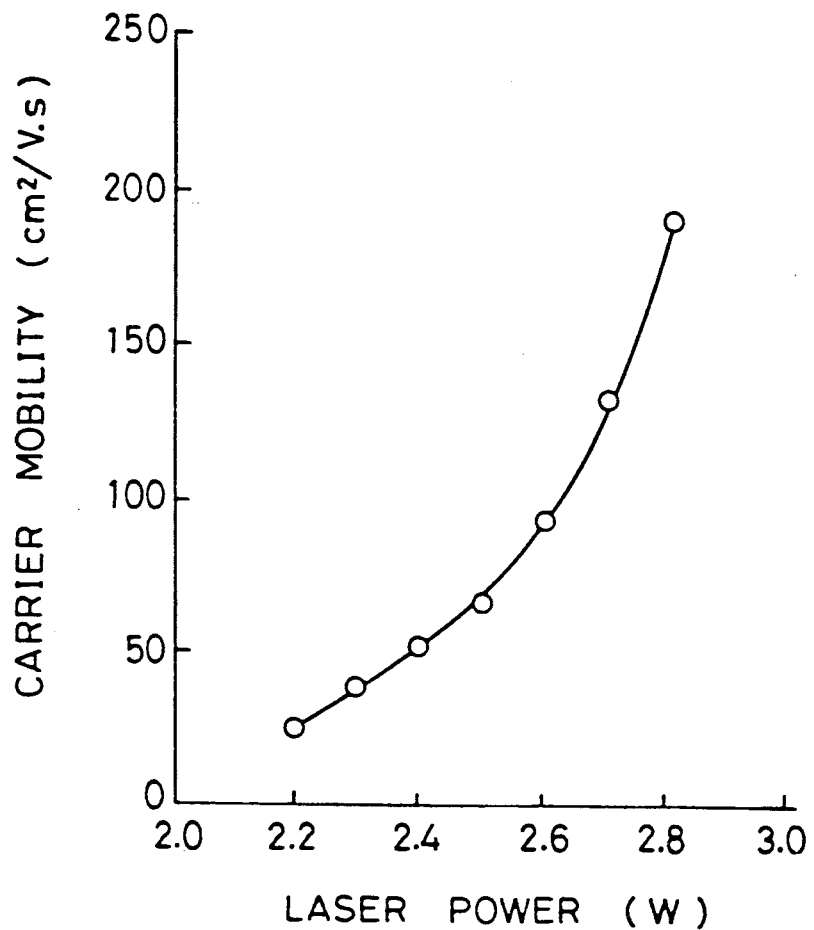
FIG. 11 is a diagram illustrating the relationship between the laser power at the time of annealing by laser irradiation and the carrier mobility in thin film silicon semiconductor devices produces by the process of the present invention.

The properties of a thin polycrystalline silicon film and the characteristics of a thin film silicon semiconductor device vary depending on annealing conditions for polycrystallization. Thin amorphous silicon films deposited by sputtering at an argon gas pressure of 2.0 Pa were polycrystallized by irradiation with argon laser beams at various irradiation powers, followed by the process shown in FIGS. 4A–4D to produce thin film silicon semiconductor devices. FIG. 11 shows the relationship between the carrier mobility and the laser beam power in the semiconductor devices thus produced. The irradiation time was one millisecond in every case. It can be seen from these results that carrier mobility notably increases with an increase in the laser beam power.

Thin amorphous silicon films deposited by sputtering at an argon gas pressure of 2.0 Pa were respectively irradiated with an argon laser beam for various irradiation times to effect polycrystallization thereof, followed by the process shown in FIGS. 4A–4D to produce thin film silicon semiconductor devices.

Figure 12:
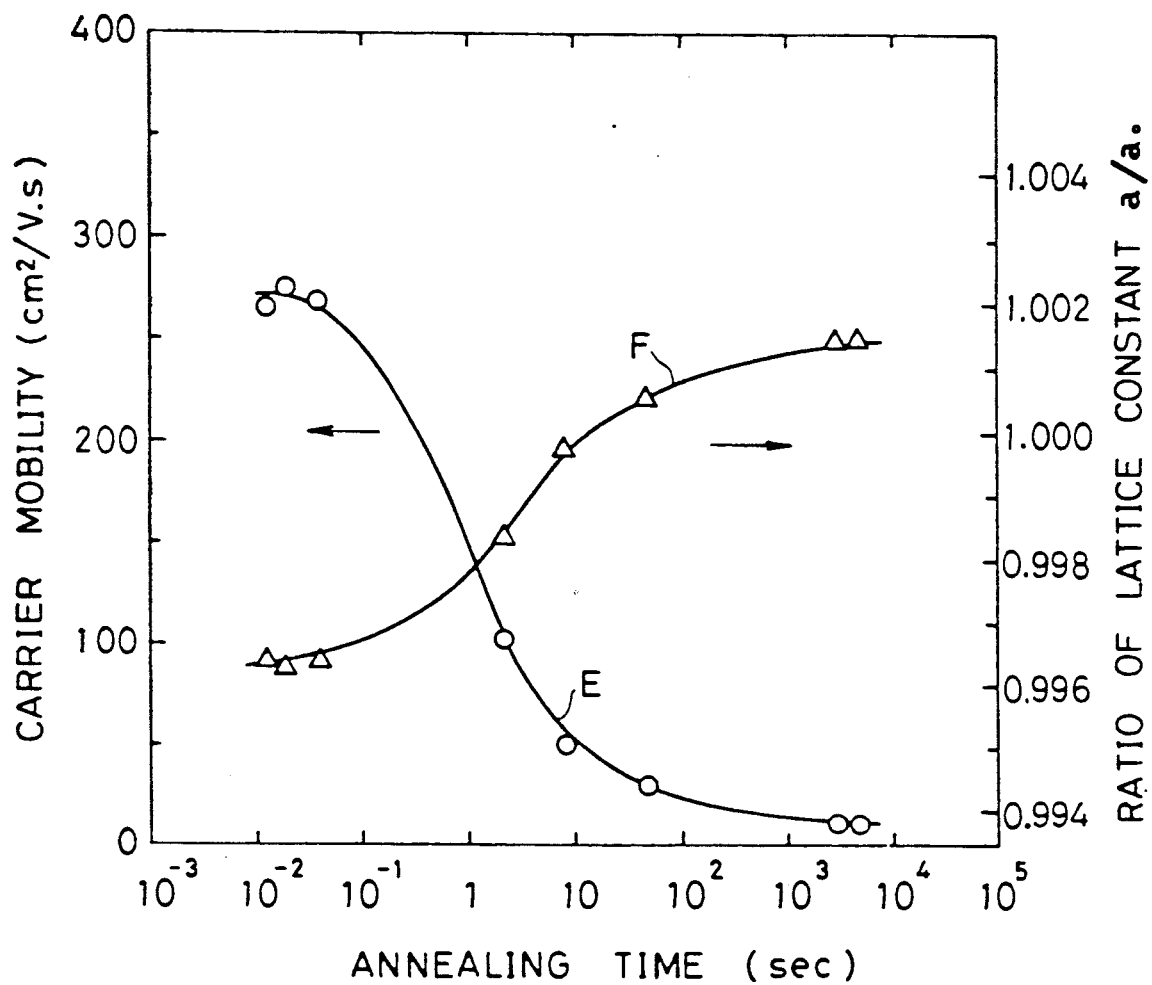
FIG. 12 is a diagram illustrating variations of the carrier mobility and the lattice constant with the annealing time.

FIG. 12 shows variations of the carrier mobility (Curve E) and the rate of change in the lattice constant of thin polycrystalline silicon film (Curve F) compared to annealing time. When the annealing time was 50 milliseconds or shorter, a laser beam irradiation method was employed. When the annealing time was one second to 600 seconds, an infrared irradiation method was employed. When the annealing time was longer than 600 seconds, annealing was conducted in an electric furnace. The laser beam irradiation was conducted by scanning a laser beam having a diameter of 50 $\mu$m and an irradiation output of 2.8 W. In the case of the infrared irradiation, the whole surface of a thin silicon film was irradiated with infrared rays to keep the surface temperature of the thin film at 1,200° C. In the case of annealing in the electric furnace, the temperature of the electric furnace was kept at 1,100° C. Annealing for up to 10 seconds gave thin polycrystalline silicon films having a lattice constant smaller than that of a silicon single crystal and thin film silicon semiconductor devices having a high carrier mobility. When the annealing time was longer than 10 seconds, however, the carrier mobility decreased.

As described above, a thin polycrystalline silicon film according to the present invention has a lattice constant smaller than that of a silicon single crystal, and conditions for obtaining such a thin polycrystalline silicon film involve a pressure of 3.5 Pa or lower at the time of sputtering and an annealing time of 10 seconds or shorter for polycrystallization.

Figure 13:
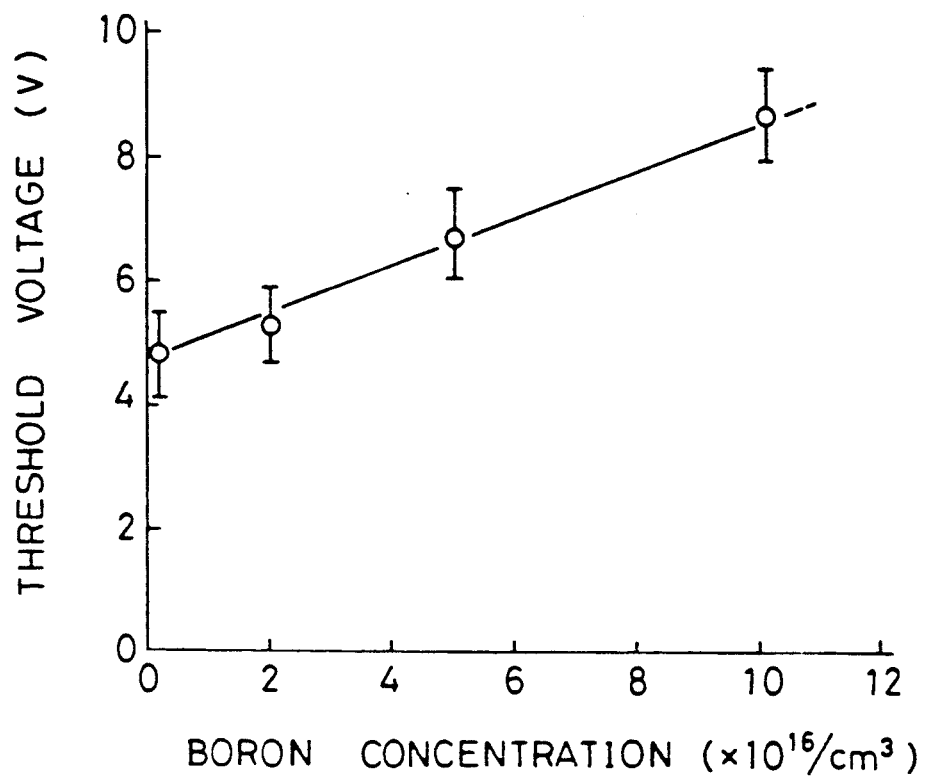
FIG. 13 is a diagram illustrating the relationship between the boron concentration of a thin silicon film and the threshold voltage in thin film silicon semiconductor devices produced by the process of the present invention.

FIG. 13 is a diagram illustrating the relationship between the boron (B) concentration of a thin silicon film and the gate voltage for initiating operation of a semiconductor device comprising the thin silicon film, namely the threshold voltage. Here, introduction of boron into a thin silicon film was carried out by ion implantation after the deposition of the thin silicon film by sputtering. The boron concentration is a value calculated from the amount of ion implantation and the thickness of the silicon film. It can be understood from the results shown in this figure that the threshold voltage increases with an increase in the boron concentration, thus indicating that the threshold voltage can be controlled by the boron concentration. When the boron concentration is less than $10^{14}/cm^3$ the introduction of the boron is not effective while the concentration is higher than $10^{17}/cm^3$, the resulting thin silicon film acts as a high concentration impurity-doped resistor incapable of allowing a sufficiently high on-off current ratio to be secure, leading to difficulty in operating a semiconductor device made of that material. Stated, another way, a method in which sputtering is effected using a sputtering target as shown in FIG. 5 which contains a predetermined amount of boron, that is $10^{14}$–$10^{17}/cm^3$, may be employed as the method of introducing boron into a thin silicon film. Compared to the ion implantation method, this method enables the introduction of boron to be effected uniformly in the direction of growth of a thin silicon film simultaneously with the formation of the thin silicon film by the mere preliminary addition of a predetermined amount of boron to a target, thus advantageously leading to a reduction in the number of production steps.

The thickness of a thin silicon film for effectively embodying the present invention is most suitably in a range of 0.01 to 2.0 $\mu$m. When it is smaller than 0.01 $\mu$m, uniform annealing is difficult. When it exceeds 20 $\mu$m, patterning of a thin silicon film by etching is so difficult that a semiconductor device having a thin structure cannot be produced.

Although argon was used as the sputtering gas in the foregoing examples, other inert gas such as helium, neon, xenon or krypton, or a mixture of various inert gases may be used to obtain the thin amorphous silicon film having excellent characteristics. Although the laser beam irradiation method was employed as the short-time annealing method for effecting crystallization of a thin amorphous silicon film in the foregoing examples, other methods including an electron beam irradiation method and an infrared irradiation method can be employed. The electron beam irradiation method is suitable for production of a semiconductor device and a three-dimensional integrated circuit on a glass substrate since it enables selective annealing to be effected only on and around a thin silicon film while keeping a substrate at a low temperature. On the other hand, the infrared irradiation method, which uses light emitted from a halogen lamp or the like, is advantageous in that a thin silicon film can be annealed as a whole all at once. Application of either of the methods to a thin silicon film formed by sputter deposition according to the present invention can easily effect polycrystallizaiton of the thin silicon film to enable a thin film silicon semiconductor device having excellent characteristics to be produces compared to the laser beam irradiation method. When the annealing time for polycrystallization exceeds 10 seconds, in the case of the infrared irradiation method for example, however, not only a thin silicon film but also the substrate is heated, and, in the case of a three-dimensional integrated circuit, lower-layer semiconductor devices are deteriorated or broken. Thus, the annealing time must be 10 seconds or shorter.

Figure 1:
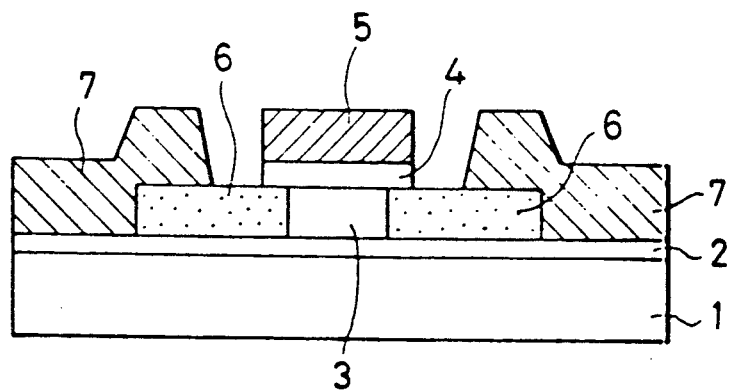
FIG. 1 is a cross-sectional view of a prior art thin film silicon semiconductor device having a coplanar structure.
Figure 2:
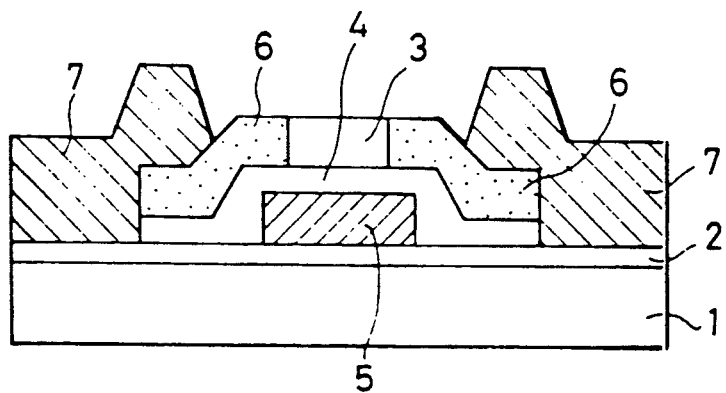
FIG. 2 is a cross-sectional view of a prior art thin film silicon semiconductor device having a staggered structure.

The present invention can also be applied to both an N-channel type and a P-channel type thin film silicon semiconductor devices. Specifically, the two types of thin film silicon semiconductor devices as shown in FIGS. 1 and 2 respectively include an N-channel type using electrons as carriers and a P-channel type using holes as carriers like a single crystal bulk semiconductor device. The former can be produced by adding phosphorus or arsenic as an N-type impurity to silicon in the source electrode/drain electrode while the latter can be produced by adding boron as a P-type impurity to silicon in the source electrode/drain electrode. The effective concentration of phosphorus and arsenic is equal to that of boron, i.e. and within the range from $10^{14}/cm^3$ to $10^{17}/cm^3$. Phosphorus and arsenic can be introduced by sputter deposition. Although the description has been mainly made of coplanar structures in the foregoing examples, the present invention can also be applied to a staggered structure. Specifically, a gate electrode is first formed, a gate insulating film is then deposited, and thereafter a thin silicon film is formed, followed by relatively short annealing. Thus, a thin film silicon semiconductor device having a staggered structure can be produced but only changing the order of the steps involved in the production of a thin film silicon semiconductor device having a coplanar structure. It will be apparent that this provides a thin film silicon semiconductor device having excellent characteristics.

As described above, a thin film silicon semiconductor device which has excellent characteristics despite a fine crystal grain size can be produced by short annealing with the substrate temperature being kept low. Therefore, an inexpensive substrate can be used and even a fine semiconductor device can be easily produced. Accordingly, the present invention produces high-performance thin film silicon semiconductor devices at low cost and in high yield.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A thin film silicon semiconductor device comprising:
   an insulating substrate;
   a thin polycrystalline silicon film disposed on a surface of said insulating substrate, said thin polycrystalline silicon film comprising fine crystal grains having a lattice constant smaller than the lattice constant of a bulk single crystal of silicon;
   a gate insulating film disposed on said thin polycrystalline silicon film;
   a gate electrode disposed on said gate insulating film; and
   source and drain electrodes formed in respective portions of said thin polycrystalline silicon film, said gate electrode being interposed between said source and drain electrodes.

2. A thin film silicon semiconductor device as claimed in claim 1, wherein said thin polycrystalline silicon film contains boron in a concentration of $10^{14}$ to $10^{17} cm^3$.

3. A thin film silicon semiconductor device as claimed in claim 1, wherein said thin polycrystalline silicon film contains as an impurity at least one element selected from phosphorous and arsenic in a total impurity concentration of $10^{14}$ to $10^{17}/cm^3$.

4. A thin film silicon semiconductor device as claimed in claim 1, wherein the ratio of the lattice constant of said fine crystal grains to that of said bulk single crystal of silicon is within a range from 0.996 to 0.999.

5. A thin film silicon semiconductor device as claimed in claim 1, wherein said fine crystal grains have a [111] axis oriented in a direction substantially perpendicular to the surface of said insulating substrate.

6. A thin film silicon semiconductor device as claimed in claim 1, wherein said insulating substrate is made of glass.

7. A thin film silicon semiconductor device as claimed in claim 1, wherein said gate insulating film is composed of one of silicon oxide and silicon nitride.

8. A thin film silicon semiconductor device as claimed in claim 1, wherein said source and drain electrodes are formed by doping said thin polycrystalline silicon film with an impurity.

9. A thin film silicon semiconductor device comprising:
   an insulating substrate;
   a first insulating layer disposed on said substrate;
   a thin polycrystalline silicon film disposed on said first insulating layer, said thin polycrystalline silicon film comprising fine crystal grains having a lattice constant smaller than that of a bulk single crystal of silicon, said thin polycrystalline silicone film having channel, source and drain regions, said channel region being interposed between said source and drain regions;
   a second insulating layer disposed on said channel region; and
   a gate electrode disposed on said second insulating layer.

10. A thin film silicon semiconductor device as claimed in claim 9, wherein said channel region is doped with boron.

11. A thin film silicon semiconductor device as claimed in claim 9, wherein said channel region is doped with at least one element selected from phosphorus and arsenic.

12. A thin film silicon semiconductor device comprising:
    an insulating substrate;
    a first insulating layer disposed on a surface of said substrate;
    a gate electrode disposed on said first insulating layer;
    a second insulating layer disposed on said gate electrode and said first insulating layer;
    a thin polycrystalline silicon film disposed on said second insulating layer, said thin polycrystalline silicon film comprising a large number of fine crystal grains having a lattice constant smaller than that of a bulk single crystal of silicon, said thin polycrystalline silicon film having a source electrode region, a drain electrode region and a channel region, the channel region being interposed between said source electrode region and said drain electrode region.

13. A thin film silicon semiconductor device as claimed in claim 12, wherein said source electrode and drain electrode region are formed by introducing an impurity into said thin polycrystalline silicon film.

* * * * *